United States Patent [19]

Grunwald et al.

[11] 3,959,523

[45] May 25, 1976

[54] ADDITIVE PRINTED CIRCUIT BOARDS AND METHOD OF MANUFACTURE

[75] Inventors: John J. Grunwald, Waterbury; Peter E. Kukanskis, Naugatuck; Elaine F. Jacovich, Cheshire; Eugene D. D'Ottavio, Waterbury, all of Conn.

[73] Assignee: MacDermid Incorporated, Waterbury, Conn.

[22] Filed: Dec. 14, 1973

[21] Appl. No.: 424,896

[52] U.S. Cl. .................................. 427/98; 427/282; 427/306; 427/404
[51] Int. Cl.$^2$ ...................... C23C 3/02; B05D 5/12
[58] Field of Search ............ 117/47 A, 212; 427/98, 427/306, 282, 404

[56] References Cited
UNITED STATES PATENTS

| | | | |
|---|---|---|---|
| 3,562,038 | 2/1971 | Shipley et al. ................. | 117/47 A X |
| 3,666,549 | 5/1972 | Rhodenizek et al. ........... | 117/47 A X |
| 3,698,940 | 10/1972 | Mersereau et al. ............ | 117/47 A X |
| 3,745,095 | 7/1973 | Chadwick et al. ............. | 117/47 A X |

*Primary Examiner*—Ralph S. Kendall
*Assistant Examiner*—John D. Smith
*Attorney, Agent, or Firm*—Steward & Steward

[57] ABSTRACT

Circuit boards for electronic equipment are produced in which the circuit-forming conductor metal is deposited on a suitably catalyzed and masked resin substrate by an all-additive electroless deposition technique, in which the characterizing feature is the use of a two-stage metal deposition to build up the desired total thickness of metal. In the first stage a fine grained, thin deposit of metal is produced on the substrate which is then water rinsed and immersed in a second metal bath having a sufficiently high rate of deposition to produce the desired total thickness of metal in a commercially practical period of time. Improved adhesion of plated metal to the resin substrate, both before and after thermal shock, is achieved by resort to this two-stage plating procedure.

6 Claims, No Drawings

ADDITIVE PRINTED CIRCUIT BOARDS AND METHOD OF MANUFACTURE

BACKGROUND OF THE INVENTION

U.S. Pat. Nos. 3,620,933 and 3,666,549 describe novel ways to produce printed circuts additively, and the methods taught are now used commercially on large scale. Essentially the methods comprise first producing a laminate of specially treated metal foil and a polymerized resin support or substrate. The metal foil of this initial laminate is a sacrificial foil, in that it is completely removed prior to use of the substrate in the electroless plating operation. Apart from the mechanical effect of protecting the surface of the substrate against scratching, dirt, or other contamination prior to removal of the foil, the foil serves primarily as a means of modifying the nature of the substrate surface so that it becomes highly receptive, on chemically dissolving the foil from the surface, to metal deposits applied by known electroless plating techniques, or other deposition procedures such as vacuum metalizing for example. The inventions disclosed in these patents are especially useful in the manufacture of printed circuit boards because of the protective barrier offered by the sacrificial metal foil, prior to use of the laminates in producing the finished circuit boards. But some difficulty has been encountered in obtaining adequate adhesion, particularly in respect to thermal shock resistance, of circuit boards produced from such substrates by what is called an all-additive electroless plating process unless the pre-plating and plating operations are interrupted to introduce a baking of the boards.

There are two ways to produce a printed circuit board using the techniques described in the above patents. One, the so-called "semi-additive" method, consists in catalyzing the whole surface of the pretreated substrate, metalizing the entire surface of the laminate with a thin metal film by electroless deposition, and then applying an organic coating or resist in a defined pattern or mask to outline the desired circuit configuration on the board. The plating operation is interrupted at this point to dry and then bake the board to develop good adhesion of the initial metal film to the substrate. The plating operations are then resumed, and an electrolytic plating operation, using this initial metal film as an electrical bus bar on the substrate surface, is then employed to build up additional metal, usually copper and solder, to the desired total thickness in the unmasked areas which will serve as the circuit board conductors. After this has been done, the organic resist is removed and the unwanted (originally masked and therefore still thin-film) areas of the electrolessly deposited metal are etched away chemically, leaving only the heavier electroplated areas to define the printed circuit.

The other method, which is the above-mentioned "all-additive" method, involves no initial deposition of the "bus bar" film and subsequent etching away of unwanted portions of it. In this method, the entire substrate is also catalyzed and dried, but before any metal is deposited, a standard organic polymer resist coating is applied directly on the substrate surface to define the non-circuit areas. The resulting panel is then treated with a dilute acid or base to reactivate or accelerate unmasked circuit areas, and the panel is immersed in an electroless plating solution where is is retained until the total desired thickness of electroless metal deposit is built up. Baking at some point prior to completion of the plating operations is again needed to develope adequate peel strength or bond between the plastic and metal, especially where the board is subject to thermal shock as occasioned by soldering operations.

It is also possible to employ a different technique of preparing substrates for all-additive plating in accordance with the teaching of U.S. Pat. No. 3,698,940. In this procedure no sacrificial metal cladding is used to modify the substrate surface; instead the resin substrate is first subjected to a particular type of organic solvent etching, followed by treatment in a hexavalent chromic-sulfuric acid solution. These boards may then be electrolessly plated by either the semi-additive or the all-additive procedures described above. While circuit boards of this type produced by the all-additive plating technique are somewhat better in terms of peel strength or adhesion of plated metal to plastic than are boards produced from the sacrificial metal clad laminates, a baking operation prior to completion of the plating operations is again required to develope acceptable bond strength. Moreover there is a practical disadvantage of the organic solvent-acid etched substrates in that the activated surface is unprotected so that care must be exercised to prevent it from becoming scratched, dirty or otherwise contaminated before being electrolessly plated. This means that the plater himself must perform the surface preparation operations which introduce difficulties of fire hazard with the organic solvent and pollution resulting from the chromic acid etch. These difficulties are avoided by use of the sacrificial metal clad laminates since a plastic fabricator can prepare the laminates in bulk, store and then ship it to the plater as needed. All the plater must do is chemically strip the sacrificial metal from the surface, as by a simple inorganic acid bath, to ready the boards for the plating operations.

While the all-additive plating processes taught by the foregoing patents has been commercially attractive, it was found that difficulties arose in meeting the more severe adhesion tests that industry has come to require.

SUMMARY OF THE INVENTION

It has now been found that to produce a circuit board by an all-additive process which permits the use of electroless plating solutions having commercially acceptable deposition rates of the order of at least 0.1 mil (100 millionths of an inch) per hour, and preferably 0.2 mil or higher, a procedure involving subjecting the board to separate plating solutions in a two-stage electroless plating operation is uniquely effective. Substantially improved adhesion is obtained without necessity to interrupt the plating steps for the heretofore required baking operation.

The initial electroless metal deposit can be nickel, cobalt or copper and in any event is limited to a thin film amounting to a minor fraction of the total thickness of metal deposit required for circuit board purposes. If copper is used in forming the initial film, the copper bath must be one having a slow rate of metal deposition, such a bath apparently better enabling the initial deposit of electroless copper to form in the microporosities of the substrate surface and achieve more intimate contact therewith. If the initial metal film is nickel or cobalt, a somewhat higher rate of deposition is satisfactory. After the initial metal film has been deposited, the board is water rinsed and immersed without interruption for baking as heretofore required, in a second, separate plating solution of high deposition rate normally used in electroless plating to complete the desired total final thickness of metal deposited within a commercially practical time.

Electroless nickel is preferred in producing the initial deposit. Nickel and cobalt for some reason not yet fully understood show greater ability to produce good bond strength between the plastic and the metal, even if the initial deposit is applied at somewhat higher deposition rates than generally recommended herein as giving best results.

One of the preferred embodiments of this invention involves a method in which a suitably catalyzed and masked polymerized resin substrate is first electrolessly plated with nickel to provide a very thin initial metal film, after which the incipient circuit board is rinsed and then run into an electroless copper basth to build up a metal composite having the total required thickness in the desired circuit areas. No interruption of the cycle to perform a baking operation prior to completion of all plating steps is involved in this novel procedure.

It is accordingly an object of this invention to produce circuit boards by all-additive plating techniques, eliminating an electrolytic plating, or chemical etching as in the semi-additive procedure, which circuit boards have improved adhesion properties of metal to polymer in comparison with the boards heretofore plated by all-additive methods. An important objective of this invention is to provide a method of achieving such improved circuit boards by exclusively or totally additive techniques compatible with commercially practical plating conditions.

Several examples utilizing the concept of this invention are given below for achieving these objectives. In general these procedures illustrate the presently known best methods of practicing the invention; it will be obvious, however, that details of operation can be changed, once the basic concept is understood, within the scope of the invention.

Preparation of Printed Circuit Boards

In this procedure the starting metal clad laminate is prepared in accordance with the teaching of U.S. Pat. Nos. 3,620,933 and 3,666,549 in which a metal cladding of aluminum foil having an anodically treated surface is bonded to a thermoset resin substrate by heat and pressure, with the anodized surface of the foil abutting the resin. The aluminum sheet or foil may be as thin is as practical to handle in the laminating operation, since this cladding metal will not be used for circuit-forming purposes but is chemically stripped or etched completely from the board prior to application of any conductive circuit thereto. Where, as mentioned above, the cladding metal is anodized aluminum, suitable stripping etchants are hydrochloric acid or sodium hydroxide. The starting laminates are immersed in such stripping solutions until all trace of laminated metal is removed. Following the stripping of the aluminum cladding, the substrate is then catalyzed in known manner for electroless plating. This may follow the two-step procedure employing separate tin chloride (sensitizing) and palladium chloride (seeding) solutions; or it may follow the so-called one-step procedure using a mixed tin-palladium chloride solution of complexed and/or colloidal nature. The exact physical and chemical characteristics of such solution is not well understood but it results from mixing tin (II) chloride and palladium (II) chloride in certain concentrations and under certain conditions. Examples of procedures and conditions for preparing such catalyzing solutions are disclosed in various U.S. Patents, including Nos. 3,532,518, 3,011,920, 3,672,923, 3,672,938 and 3,682,671. The resulting catalyzing solutions differ in various respects but all are operative in the practice of this invention. After the board is catalyzed by immersing it in the solution, it is dried and a resist coating is applied in selected areas or desired pattern configuration to prevent deposition of electroless metal on non-circuit or unwanted areas. The resist coating is cured if the type selected so requires, after which the board is subjected to a dilute solution of suitable acid or alkali to regenerate the catalytic actitity of the resin substrate in the exposed (circuit-forming) areas.

The initial coating of metal of the two-stage electroless deposition technique characterizing this invention is then deposited followed immediately, without baking after rinsing, by a second deposition of metal from an electroless plating bath designed to give the desired total conductor thickness in a reasonable period of time. When sufficient total metal has been deposited, the circuit board is rinsed, dried, and after all plating tank operations are completed it is generally baked at approximately 250° to 300°F. in an oven for about an hour.

The composite or layered metal deposit thus produced on the boards is found to have unusually good and uniformly achieved adhesion characteristics. The procedure provides tolerance for marginal plating practices which are often encountered in actual commercial plating shop operation. Tests of the plated metal composite for adhesion to the plastic substrate were made on circuit boards processed by various combinations of the novel two-step electroless plating technique, and adhesion values were obtained both before and after subjecting the circuit boards to thermal shock; e.g. immersion in molten solder. Details of the tests appear in the examples given below and the accompanying table.

EXAMPLE I

An aluminum clad board prepared as described in U.S. Pat. Nos. 3,620,933 and 3,666,549 is optionally cleaned of any surface grime by mild detergent solution. In this example, a glass-epoxy substrate commonly referred to as "FR-4" is used. The board is dipped or otherwise contacted with an aluminum etching solution to completely strip the anodically treated aluminum cladding from its surface, and the exposed resin surface is then catalyzed using a palladium catalyst system as described in the above mentioned U.S. Pat. No. 3,532,518. A conventional resist coating which may be an organic polymer material, is applied to the catalyzed surface to define and cover areas of the board not desired to be plated. A choice of several other methods in the selection and application of the resist coating, all of which are known in the art, is available. The board is next subjected to an accelerating solution, for example a dilute solution of suitable acid or alkali, to regenerate the catalytic activity in the areas not covered by resist.

After rinsing, the board is plated in the first electroless plating bath of the two-stage deposition process. In this example a commercially available electroless nickel composition is used. Various compositions of suitable nickel plating baths are shown, for example in U.S. Pat. Nos. 2,532,263 and 3,062,666. These differ in detail but are generally alike in providing a source of nickel in soluble salt form, a nickel reductant, a nickel ion complexer, water and pH adjuster such as ammonium hydroxide. Standard plating baths work with varying degrees of suitably depending upon exact proportioning of components, but good results are obtained from a bath containing:

| | |
|---|---|
| Nickel chloride hexahydrate | 18–24 g. |
| Citric acid | 10 g. |
| Sodium hypophosphite | 10 g. |
| Ammonium hydroxide | to give pH 8.8–9.2 |
| Water | to make 1 liter |

This bath is operated at room temperature and the concentration of the reductant (hypophosphite) is deliberately maintained at a level below that normally used in electroless plating to produce a deposition rate of around 0.03 mil (30 millionths of an inch) per hour. After sufficient electroless nickel has been deposited---approximately 0.005 mil (5 millionths of an inch) is enough for the purposes of this invention--the board is rinsed and then further plated, immediately without the customary prior art bake cycle, this time in a high speed electroless copper bath designed to complete within a commercially practical time period the build-up to the desired total thickness of a metal composite needed for conductor purposes. In this case an electroless copper bath is prepared having the following composition:

| | |
|---|---|
| Copper sulfate (hexahydrate) | 5–10 g. |
| Formaldehyde (37%) | 4–8 ml. |
| Surfactant | 1 g. |
| Sodium hydroxide | 3.5–7 g. |
| Cupric ion complexer (EDTA type) | 15 g. |
| Cuprous ion stabilizer (Sodium cyanide) | 5–15 ppm |
| Organic stabilizer (Thiourea) | 0.09 mg. |
| Water | to make one liter |

Other specific formulations of suitable electroless copper baths are disclosed in U.S. Pat. Nos. 2,874,072, 3,075,855 and 3,095,309.

This plating bath is operated at a temperature of from 125°–160°F, preferably about 140°F. The plating rate of such bath is approximately 0.1 mil per hour of copper. Usually a minimum of 0.001 inch (1.0 mil) of total deposited metal is required in order to be able to make the conventional peel strength test (measure of adhesion of metal to polymer), so this thickness of metal composite is used in this example and all of the others here reported. Commercial practice may require thicker deposits.

After plating is completed, the board is rinsed, dried and baked in an oven at about 250° to 300°F. for an hour. Upon cooling, adhesion tests gave values of 12 to 13 lbs./in. peel strength.

Printed circuit boards are usually subjected to soldering operations designed to permanently mount various electronic components that constitute or complement the electrical circuit. It is imperative that these soldering operations do not result in a weakened metal-to-polymer bond. A post-soldering adhesion test was also done on the circuit boards in the tests here reported. A specimen of circuit board produced in accordance with this example, when submersed in molten solder maintained at 500° ± 10°F. for 10 seconds, then allowed to cool, shows adhesion values of 13 to 14 lbs./in., surprisingly exhibiting a slight increase over the pre-solder adhesion value. The results are tabulated in Table 1.

EXAMPLE II

The same procedure if followed as in Example I; however in this case the secondary electroless plating bath is modified to increase the concentration of the copper sulfate and/or formaldehyde content, for example, to provide a copper plating rate of 0.2 mil per hour. The increased rate can also be achieved in other ways, as by increasing temperature or reducing the concentration of stabilizers. Adhesion values obtained here were identical with those of Example I above, both before and after soldering. See Table 1.

EXAMPLE III

Again the procedure used in Example I is repeated; however, the initial electroless nickel bath is modified to increase the deposition rate to approximately 0.1 mil per hour. The second-stage electroless plating bath is the same working copper bath as used before, having a rate of approximately 0.1 mil per hour. Pre-solder adhesion value is 11 to 12 lbs./in.; post-solder adhesion also is 11 to 12 lbs./in.

EXAMPLE IV

Same as Example III, but in this case the second-stage electroless copper bath is modified to increase its deposition rate to 0.2 mil per hour, as in Example II. Adhesion values are identical with those of Example III.

EXAMPLE V

Same as Example I, but the bath temperature and hypophosphite concentration are increased in the first-stage electroless nickel bath to give a plating rate of approximately 0.2 mil per hour. The second stage plating operation is identical with Example I. Pre-solder adhesion is 11 to 12 lbs./in.; post-solder adhesion is 11 to 13 lbs./in.

EXAMPLE VI

Same as Example V, except that the electroless copper working bath is the same as that used in Example II; i.e., one having a rate of 0.2 mil per hour of copper deposition at room temperature. Pre-solder adhesion is 11 to 12 lbs./in.; post-solder adhesion is the same.

EXAMPLE VII

In this case the same procedure is used for preparing the board for deposition as in Example I; but here both the first and second stage electroless plating baths are copper baths. A first stage bath was used having the following composition:

| | |
|---|---|
| Copper sulfate (hexahydrate) | 5 g. |
| Formaldehyde (37%) | 5 ml. |
| Surfactant | 1 g. |
| Sodium hydroxide | 5 g. |
| Cupric ion complexer (EDTA type) | 20–30 g. |
| Organic stabilizer (Dithiobiuret) | 0.5–0.9 mg. |
| Water | to make 1 liter |

This bath, operated at room temperature, has a plating rate of about 0.03 mil per hour. Here again, a sufficient amount of initial copper is deposited to permeate the micro-porosites on the surface; from 5 to 20 millionths of an inch (0.005 to 0.02 mil) is sufficient for this purpose. The second-stage electroless bath, also copper in this case, has a plating rate of 0.1 mil per hour, being the same bath as used in Example I. After a build up of metal composite having the desired total thickness (1 mil), the board is rinsed, dired and baked at 250° to 270°F. for about an hour. Adhesion values obtained are 9 to 11 lbs./in. prior to the solder test; 9 to 10 lbs./in. after solder test.

EXAMPLE VIII

Same as Example VII, except in this case the second stage electroless copper bath is adjusted to provide a plating rate of 0.2 mil per hour, as in Example II. Adhesion values are essentially the same as those obtained in preceding Example VII.

EXAMPLE IX

In this case the total deposit of 1.0 mil thick electroless copper is obtained by using a single copper bath giving a deposit of 0.1 mil per hour in a one-stage operation. That is, the working copper bath of the second stage of Example I is employed exclusively in this case, and without interruption until the total 1.0 mil deposit is obtained. The adhesion values obtained under this condition give peel strengths of 3 to 4 lbs./in. prior to solder test and 1 to 2 lbs./in. after such test. Visual inspection of the plated deposit in this case also show some areas of foil blistering.

EXAMPLE X

In this case the test is modified by employing a two-stage electroless copper plating procedure, in which the working bath of the first stage is the same as that of Example IX (0.1 mil of copper per hour), and the board is maintained in this to provide an initial deposit of 0.02 mil thickness. The board is then withdrawn, water rinsed and transferred to a second stage electroless copper plating bath having a deposition rate of 0.2 mil of copper per hour, where it is retained to complete the build-up to a total metal composite thickness of 1.0 mil. The results of the adhesion tests on this circuit board are not noticeably different from those of Example IX.

EXAMPLE XI

This example utilizes a single step electroless copper deposition procedure where the rate of copper deposit is 0.2 mil per hour, the deposition being continued to develop a total thickness of 1.0 mil. Adhesion results are: Pre-solder, 1 to 2 lbs./in.; post-solder, virtually nil, with foil blistered completely away from substrate.

Using aluminum clad substrates composed of a paper reinforced phenolic resin base thermoset referred to as "FR-2" in the trade, the adhesion results obtained by duplicating the same series of tests is tabulated in Table 1. Test results using a paper reinforced epoxy resin base thermoset, commercially known as "FR-3," and a randon glass reinforced polyester base thermoplastic, are also reported in Table 1 for the same series.

This invention is also useful in plating substrates prepared in accordance with the procedure taught in the aforesaid U.S. Pat. No. 3,698,940. The following are examples.

EXAMPLE XII

A glass-epoxy "FR-4" substrate was prepared by immersion in dimethylformamide diluted 50% with water at ambient room temperature for about three to five minutes. After rinsing in water, the substrate was next immersed in a sulfuric-chromic acid bath consisting of 30 to 60 parts by weight of sulfuric acid (66° Be), 5 to 10 parts by weight of chromic acid, and 30 to 65 parts by weight water. Again the immersion was for 3 to 5 minutes at ambient room temperature.

This substrate was next catalyzed, in accordance with the above-mentioned procedure of U.S. Pat. No. 3,532,518, resist applied, regenerated and then plated in the first stage electroless nickel bath having a deposition rate of 0.03 mil per hour to provide a deposit 5 millionths of an inch (0.005 mil) thick, as in Example I above. After rinsing, the board was further plated in a high speed copper electroless bath having a deposition rate of 0.2 mil per hour (same as Example II above in this respect) to produce a total deposit of 1.0 mil. The peel strength, before and after thermal shock, was 10–11 pounds per inch and 9–10 pounds per inch, respectively.

EXAMPLE XIII

For comparison, the procedure of Example XII was repeated except that the first-stage nickel bath concentration was adjusted to produce a deposition rate of 0.2 mil per hour. However, the same initial deposit thickness (5 millionths of an inch) was maintained before rinsing, then proceeding with the same high speed (0.2 mil per hour) electroless copper to produce a metal composite of 1.0 mil thickness. The peel strengths before and after thermal shock test were 9–10 pounds and 8–9 pounds per inch respectively.

EXAMPLE XIV

The procedure above was duplicated to produce a first stage deposit of copper from a low speed (0.03 mil per hour) electroless bath, followed by a conventional high speed (0.2 mil per hour) electroless copper to produce a total deposit of 1.0 mil. The pre- and post thermal shock peel strengths were 8–10 pounds and 8–9 pounds per inch, respectively.

EXAMPLE XV

Again the foregoing procedure was repeated but using high speed (0.2 mil per hour) electroless copper baths for both the first and second plating operations. The peel strength results in this case showed 5–6 pounds before thermal shock test and only 1–3 pounds after such test. Small blisters in the copper were quite apparent in the latter case.

In general, therefore, it can be concluded that whereas the two-stage plating procedure here taught has more significant effect in a copper-copper all-additive electroless plating system, some worthwhile improvement and consistently more reliable results are also obtained in the nickel-copper system. This applies more especially to processing of sacrificial metal clad laminates, but is also applicable to substrates prepared by the organic solvent-chronic acid etch system mentioned above.

While it is best to confine the initial metal deposit to a thickness of from about 5 to 30 millionths of an inch (0.005 to 0.03 mil), and preferably from 0.005 to 0.02 mil, a maximum of 0.2 mil is still of some practical interest if somewhat reduced adhesion values can be tolerated.

TABLE 1

| | FR-4 | | FR-2 Adhesion Results | | FR-3 | | Polyester | |
|---|---|---|---|---|---|---|---|---|
| Example | Pre-Solder Adhesion | Post-Solder Adhesion | Pre-Solder Adhesion | Post-Solder Adhesion | Pre-Solder Adhesion | Post-Solder Adhesion | Pre-Solder Adhesion | Post-Solder Adhesion |
| I | 12 to 13 lbs. | 13 to 14 lbs. | 9 to 10 lbs. | 11 to 13 lbs. | 8 to 10 lbs. | 9 to 11 lbs. | 5 to 6 lbs. | 5 to 6 lbs. |
| II | 12 to 13 lbs. | 13 to 14 lbs. | 9 to 10 lbs. | 11 to 12 lbs. | 8 to 10 lbs. | 8 to 11 lbs. | 5 to 6 lbs. | 5 to 6 lbs. |
| III | 11 to 12 lbs. | 11 to 12 lbs. | 8 to 10 lbs. | 10 to 12 lbs. | 8 to 10 lbs. | 9 to 11 lbs. | 4 to 6 lbs. | 4 to 6 lbs. |
| IV | 11 to 12 lbs. | 11 to 12 lbs. | 9 to 10 lbs. | 10 to 11 lbs. | 9 to 10 lbs. | 10 to 11 lbs. | 4 to 5 lbs. | 4 to 5 lbs. |
| V | 11 to 12 lbs. | 11 to 13 lbs. | 9 to 10 lbs. | 12 to 13 lbs. | 9 to 10 lbs. | 9 to 10 lbs. | 5 to 6 lbs. | 5 to 6 lbs. |
| VI | 11 to 12 lbs. | 11 to 12 lbs. | 8 to 10 lbs. | 10 to 12 lbs. | 9 to 10 lbs. | 10 to 11 lbs. | 5 to 6 lbs. | 5 to 6 lbs. |
| VII | 9 to 11 lbs. | 9 to 10 lbs. | 9 to 11 lbs. | 9 to 10 lbs. | 8 to 10 lbs. | 8 to 10 lbs. | 3 to 5 lbs. | 3 to 5 lbs. |
| VIII | 9 to 11 lbs. | 9 to 10 lbs. | 9 to 11 lbs. | 10 to 11 lbs. | 9 to 10 lbs. | 9 to 11 lbs. | 3 to 5 lbs. | 3 to 5 lbs. |
| IX | 3 to 4 lbs. | 1 to 2 lbs. | 2 to 3 lbs. | Blister in Solder | 3 to 4 lbs. | 1 to 2 lbs. | 1 to 2 lbs. | Blister |
| X | 3 to 4 lbs. | 1 to 2 lbs. | 2 to 3 lbs. | Blister in Solder | 3 to 4 lbs. | 1 to 2 lbs. (Some blisters) | 1 to 2 lbs. | Blister |
| XI | 1 to 2 lbs. | Foil blistered from substrate | 1 to 2 lbs. (Small blisters in plate) | Blister in Solder | 1 to 2 lbs. (Some blisters in plate) | 0 lb. (Blister from substrate) | 1 to 2 lbs. | Blister |
| XII | 10 to 11 lbs. | 9 to 10 lbs. | | | | | | |
| XIII | 9 to 10 lbs. | 8 to 9 lbs. | | | | | | |
| XIV | 8 to 10 lbs. | 8 to 9 lbs. | | | | | | |
| XV | 5 to 6 lbs. | 1 to 3 lbs. | | | | | | |

What is claimed is:

1. A method for producing printed circuit boards by an all-additive electroless plating procedure which eliminates the need for interrupting the plating operations to perform an adhesion-promoting baking step heretofore required to develop adequate adhesion, which comprises immersing a suitably-masked, catalyzed-surface substrate selected from the group consisting of paper or glass fiber reinforced phenolic, epoxy and polyester resins in a first electroless metal plating bath to produce thereon a first layer of said metal on the unmasked areas of said substrate, moving said substrate from said first bath through a water rinse immediately into at least one other electroless metal plating bath, to produce a metal composite of at least two layers of electroless metal on the unmasked portions of the substrate, wherein the thickness of the metal in the second layer always substantially exceeds that of the first layer, said metal plating baths each being selected from the group consisting of electroless nickel, cobalt and copper, and wherein, when copper is selected for the first electroless metal plating bath, such bath is adjusted to give a maximum deposition rate under ambient room temperature conditions of from around 0.03 to less than 0.10 mil per hour and wherein, when cobalt or nickel is selected for the first electroless metal plating bath, such bath is adjusted to give a maximum deposition rate of from around 0.02 to 0.3 mil per hour, the thickness of the deposit in either event being from about 0.005 to 0.2 mil.

2. A method as defined in claim 1, wherein said first metal deposit is electroless nickel or electroless cobalt, and the second metal layer is electroless copper.

3. A method as defined in claim 2, wherein the deposition of metal in said first electroless plating bath is discontinued when said first deposit has a thickness of not over 0.03 mil, and continuing the deposition of metal in said second electroless bath until the total thickness of metal composite is at least about 1.0 mil.

4. The method as defined in claim 3, wherein the deposition of said first layer of metal is discontinued when the thickness thereof has reached about 0.005 to 0.02 mil.

5. A method as defined in claim 3, wherein said first electroless metal plating bath is adjusted to produce a metal deposition rate of not over 0.3 mil per hour at ambient room temperature, and said second electroless plating bath is adjusted to produce a metal deposition rate of not less than 0.1 mil per hour at ambient room temperature.

6. A method as defined in claim 5, wherein said first electroless plating bath is adjusted to produce a metal deposition rate of from 0.03 to 0.1 mil per hour, and said second electroless plating bath is adjusted to produce a metal deposition rate of from about 0.1 to 0.2 mil per hour at ambient room temperature.

* * * * *